US008405132B2

(12) United States Patent
Chang

(10) Patent No.: US 8,405,132 B2
(45) Date of Patent: Mar. 26, 2013

(54) SELF-ALIGNED SELECTIVE METAL CONTACT TO SOURCE/DRAIN DIFFUSION REGION

(75) Inventor: Peter Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 7 days.

(21) Appl. No.: 12/910,735

(22) Filed: Oct. 22, 2010

(65) Prior Publication Data
US 2011/0037105 A1 Feb. 17, 2011

Related U.S. Application Data

(62) Division of application No. 12/138,038, filed on Jun. 12, 2008, now Pat. No. 7,867,863.

(51) Int. Cl.
*H01L 29/78* (2006.01)
(52) U.S. Cl. ........ 257/288; 257/296; 257/774; 257/382; 257/388; 977/938
(58) Field of Classification Search .................. 257/288, 257/296, 734, 774; 977/938
See application file for complete search history.

(56) References Cited

U.S. PATENT DOCUMENTS

| 7,229,873 | B2 * | 6/2007 | Colombo et al. | 438/231 |
| 7,714,393 | B2 * | 5/2010 | Tai et al. | 257/369 |
| 2007/0205450 | A1 * | 9/2007 | Okita | 257/296 |
| 2007/0210448 | A1 * | 9/2007 | Wong et al. | 257/734 |
| 2009/0079014 | A1 * | 3/2009 | Sandford et al. | 257/407 |

OTHER PUBLICATIONS

Pan, James , et al., "Novel Approach to Reduce Source/Drain Series and Contact Resistance in High-Performance UTSOICMOS Devices Using Selective Electrodeless CoWP or CoB Process", IEEE Electron Device Letters, vol. 28, No. 8, (Aug. 2007), pp. 691-693.
Pan, James , et al., "Novel Approach to Reduce Source/Drain Series Resistance in High Performance CMOS Devices Using Self-Aligned CoWP Process for 45nm Node UTSOI transistors with 20nm Gate Length", 2006 Symposium on VLSI Technology Digest of Technical Papers; 2006 IEEE, (Aug. 2006), 2 pages.

* cited by examiner

*Primary Examiner* — Thanh Nguyen
(74) *Attorney, Agent, or Firm* — Blakely, Sokoloff, Taylor & Zafman LLP

(57) ABSTRACT

A transistor structure includes a semiconductor substrate with a first surface, a diffusion region at the first surface of the substrate, a sacrificial gate formed on the diffusion region, and insulating side walls formed adjacent to the sacrificial gate. A metal gate is formed by etching out the sacrificial gate and filling in the space between the insulating side walls with gate metals. Silicided source and drain contacts are formed over the diffusion region between the side walls of two adjacent aluminum gates. One or more oxide layers are formed over the substrate. Vias are formed in the oxide layers by plasma etching to expose the silicided source and drain contacts, which simultaneously oxidizes the aluminum gate metal. A first metal is selectively formed over the silicided contact by electroless deposition, but does not deposit on the oxidized aluminum gate.

10 Claims, 7 Drawing Sheets

SELF-ALIGNED SELECTIVE METAL CONTACT TO SOURCE/DRAIN DIFFUSION REGION

This is a Divisional Application of Ser. No. 12/138,038 filed Jun. 12, 2008 now U.S. Pat. No. 7,867,863.

BACKGROUND

Electroless plating is a technique conventionally used for self-aligned growth of gate metal contacts on a seed metal layer using low resistivity copper (Cu). The process succeeds primarily because Cu does not oxidize in the electroless Cu plating bath. On the other hand, aluminum (Al) readily oxidizes in aqueous plating baths so an electroless plating process has not yet been developed for a seed metal layer comprising Al. Al has a moderately higher resistivity than Cu, but a relative cost advantage. It is desirable to form self-aligned contacts on the source and drain regions while avoiding the formation of additional metallization on metal gates.

BRIEF DESCRIPTION OF THE DRAWINGS

Embodiments of the present invention are understood by referring to the figures in the attached drawings, as provided below.

Features, elements, and aspects of the invention that are referenced by the same numerals in different figures represent the same, equivalent, or similar features, elements, or aspects, in accordance with one or more embodiments.

DETAILED DESCRIPTION OF EXEMPLARY EMBODIMENTS

A transistor structure having self-aligned selective metal contacts to source and drain diffusions is provided. In one embodiment, the transistor structure comprises a semiconductor substrate with a first surface, a diffusion region at the first surface of the substrate, a sacrificial gate formed on the diffusion region, and insulating side walls formed adjacent to the sacrificial gate. A metal gate is formed by etching out the sacrificial gate and filling in the space between the insulating side walls with metal. Silicided source and drain contacts are formed over the diffusion region between the side walls of two adjacent aluminum gates. One or more oxide layers are formed over the substrate. Vias are formed in the oxide layers by plasma etching to expose the silicided source and drain contacts, which simultaneously oxidizes the metal gate.

Figure 1:
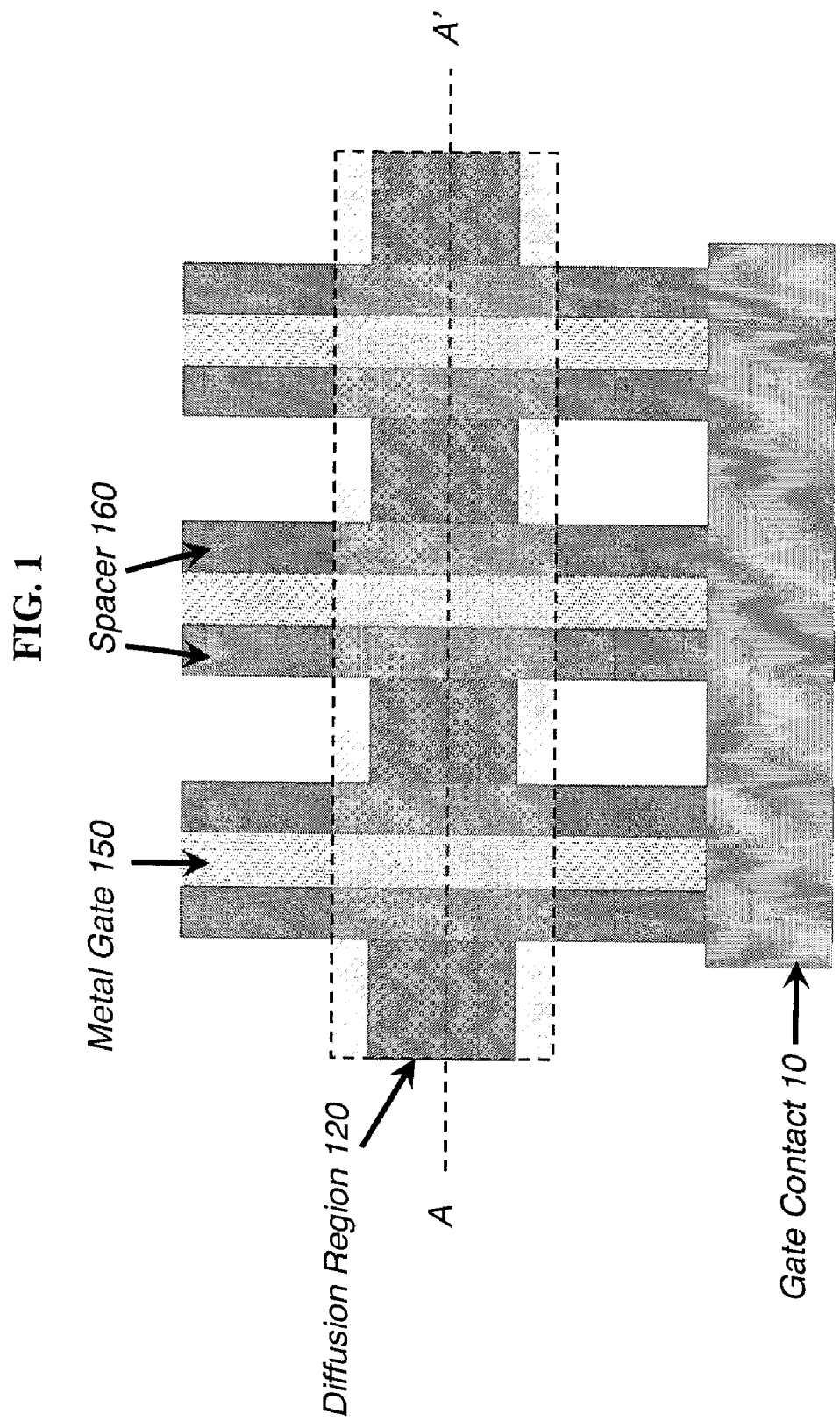
FIG. 1 shows a top view of a transistor layout according to one embodiment.

FIG. 1 shows a top view of a transistor 100 according to one implementation, where gate contacts are formed of a metal (i.e., metal gate 150), desirably by a replacement gate (RMG) process metal. In one embodiment, a sacrificial poly gate is etched out followed by a blanket metal gate fill on the wafer. The deposited metal is then polished to leave the metal in the gate region. After the polish, the top of the metal gate 150 is exposed, which may short to contacts to source and drain (S/D) unless precautions are taken to form self-aligned S/D contacts without shorting to the exposed metal gate.

In the following, one or more embodiments are disclosed, by way of example, as applicable to gate contacts formed of aluminum (Al) or copper (Cu). It is noteworthy, however, that in some embodiments any other suitable metal or compound may be utilized instead. For example, gate contact material may comprise any other element or compound that resists electroless metallization, while electroless deposition on other contacts (e.g., S/D) succeeds. Accordingly, the scope of this disclosure should not be construed as limited to Al or other exemplary material and embodiments disclosed herein.

Figure 2:
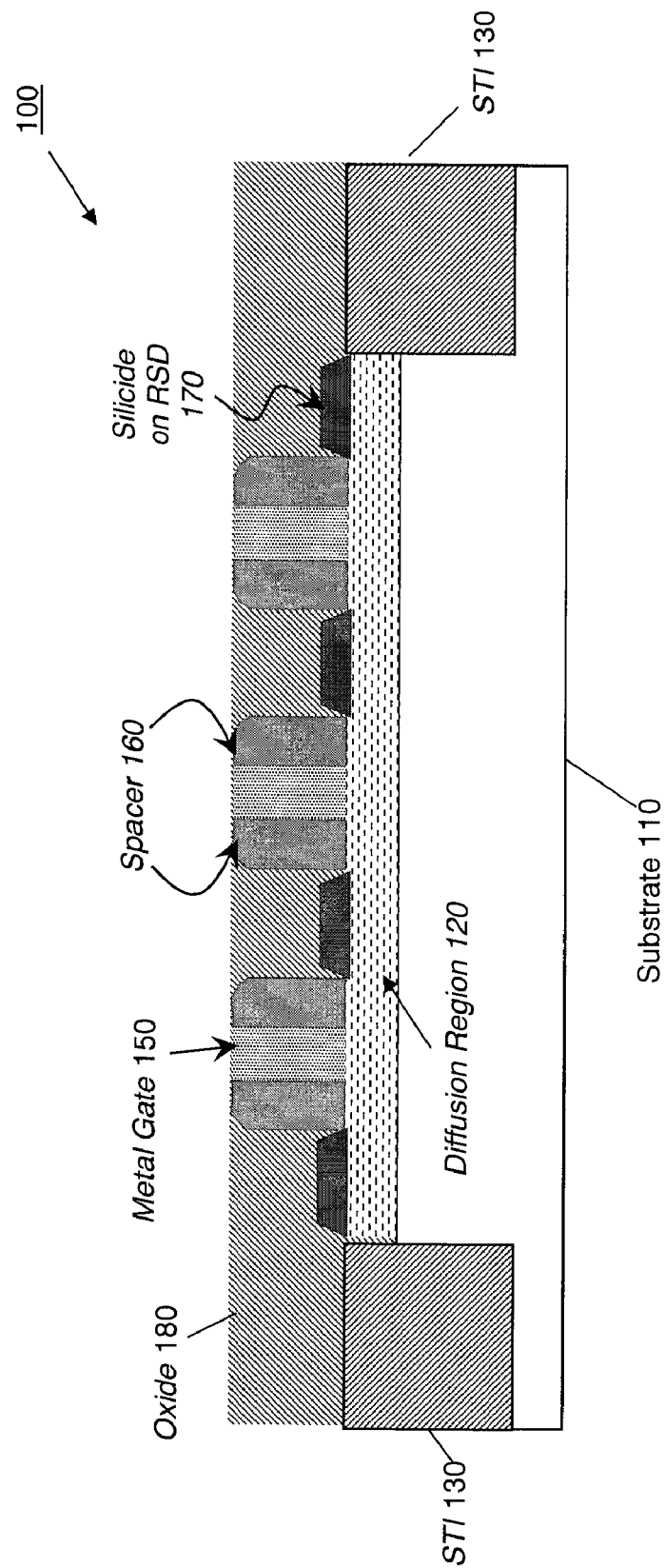
FIG. 2 shows a cross-section A-A' of the transistor layout of FIG. 1, following a replacement metal gate process step, according to one embodiment.

FIG. 2 shows a cross-section A-A' of a first intermediate stage 100 of the formation of the exemplary transistor of FIG. 1 following RMG formation of the metal gate 150. In certain embodiments, the metal gate 150 may comprise Al or Cu. For a Cu gate, a process may be implemented to form self-aligned contact using electroless plating of sacrificial cobalt (Co) deposited on the metal gate 150. For an Al gate, the electroless Co plating may not occur as the Al is readily oxidized in the plating solution. This noted property for Al, in certain embodiments, may be advantageously used to selectively deposit materials on source/drain (S/D) contacts but prevent such deposition on an Al gate.

Referring back to FIG. 2, device 100 may be formed on a substrate 110. Substrate 110 in one embodiment may comprise silicon, for example. A diffusion region 120 may be formed at the surface of substrate 110 to alter conductivity properties. In one implementation, shallow trench isolation (STI) regions 130 are formed surrounding the diffusion region 120 to electrically isolate transistor 100 from adjacent transistors or electronic device functionalities formed on substrate 110. Metal gates 150 may be formed using an RMG process. In alternate embodiments, a process other than an RMG process, such as a subtractive process, may be used to form the metal gates 150.

In accordance with one aspect, metal gate 150 is bracketed by sidewall spacers 160. Sidewall spacer 160 may be formed of an insulator such as silicon nitride, for the beneficial purpose of resisting etchants that act on oxide 180. Oxide 180 may comprise silicon dioxide in one exemplary embodiment. It is noteworthy that in certain implementations other material or combinations of different materials may be utilized to form sidewall spacer 160 and oxide 180 such that when an insulator such as oxide 180 is etched, another insulator or side wall spacer 160 is not. Diffusion region 120 may be contacted with raised S/D contacts 170 that are treated to form a silicide to enable further deposition of conductive material.

Figure 3:
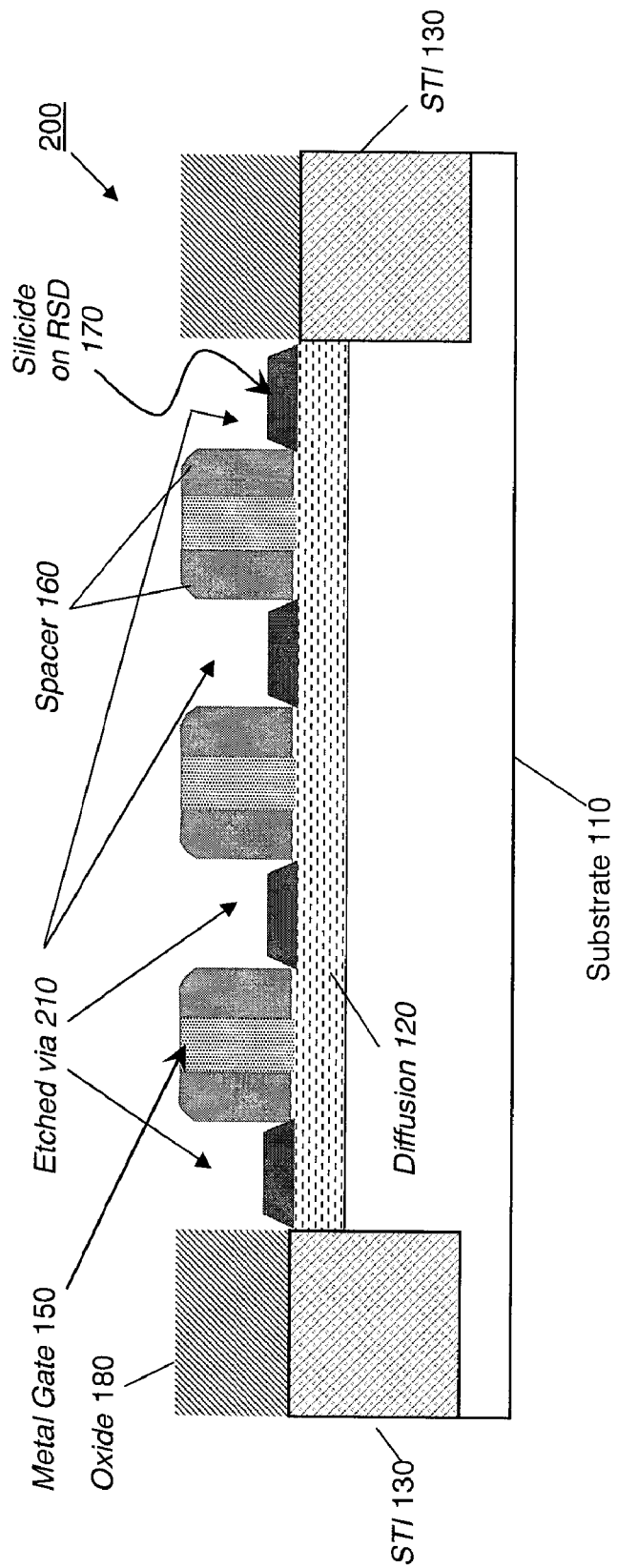
FIG. 3 shows the cross-section A-A' following an oxide etch for contact via formation according to one embodiment.

FIG. 3 shows the cross-section A-A' of a second intermediate stage 200 of the fabrication process following an oxide etch to form contact vias 210 through oxide 180 to expose silicided raised source/drain (RSD) contacts 170. It should be noted that metal gates 150 may be exposed to subsequent processes which are provided in further detail below. Etching vias 210 in oxide 180 with a plasma oxide etch method will oxidize the metal gate 150, producing a thin insulating oxide layer.

Figure 4:
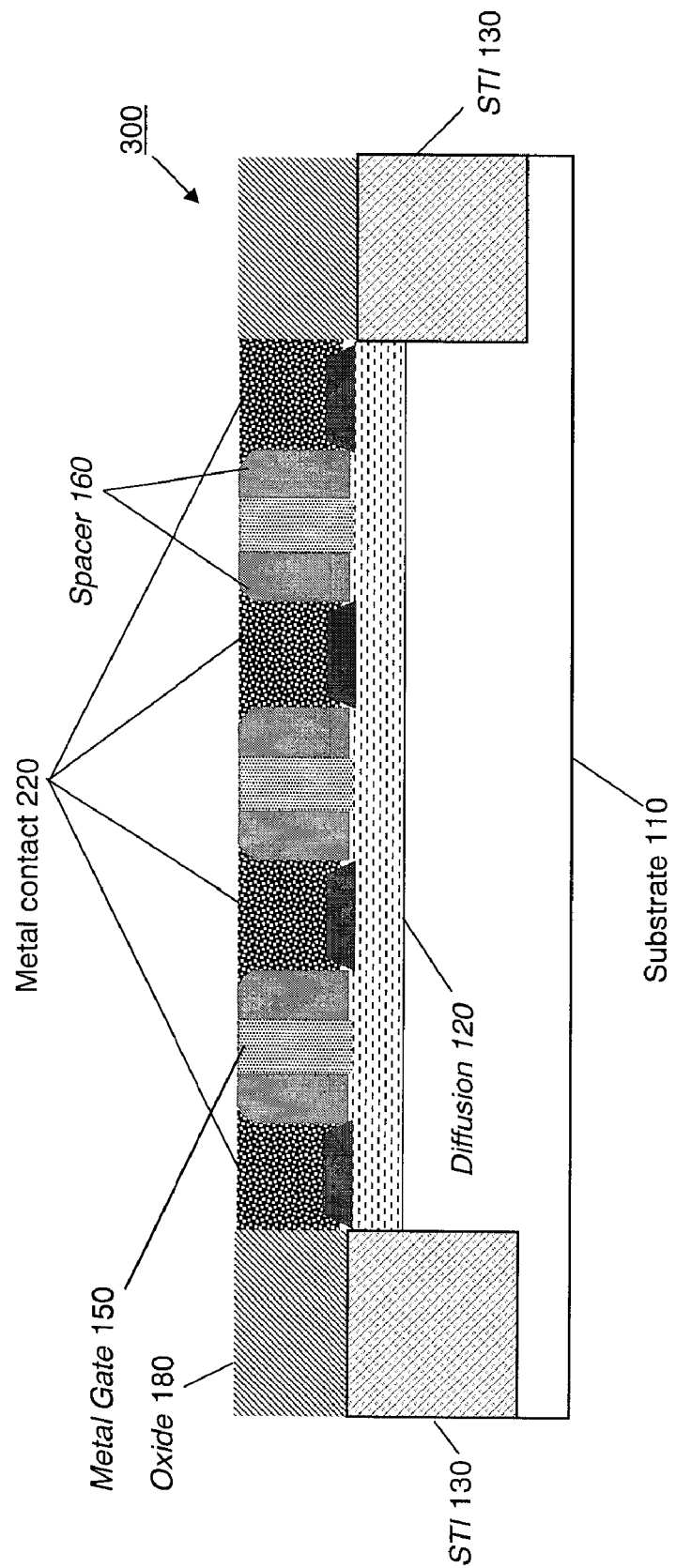
FIG. 4 shows the cross-section A-A' following formation of a metal contact in the via by electroless plating according to one embodiment.

FIG. 4 shows the cross-section A-A' of a third intermediate fabrication following formation of a metal contact 220 in the via 210 by electroless (EL) plating, for example. EL plated metal contacts 220 may be formed of one or more of CoP, CoB, CoW, CoMo, CoWB, CoMoP, CoMoB, NiWP, NiWB, NiMoP, and NiMoB or other conductive metal alloys of Co and Ni, by way of example. The inclusion of boron (B) and phosphorous (P) in the plating bath provides electrons to assist the EL plating process. Since the metal gate 150 is oxidized during oxide etch formation of via 210 and is further oxidized in the EL plating solution, no Co may be deposited on the metal gate 150.

Figure 5:
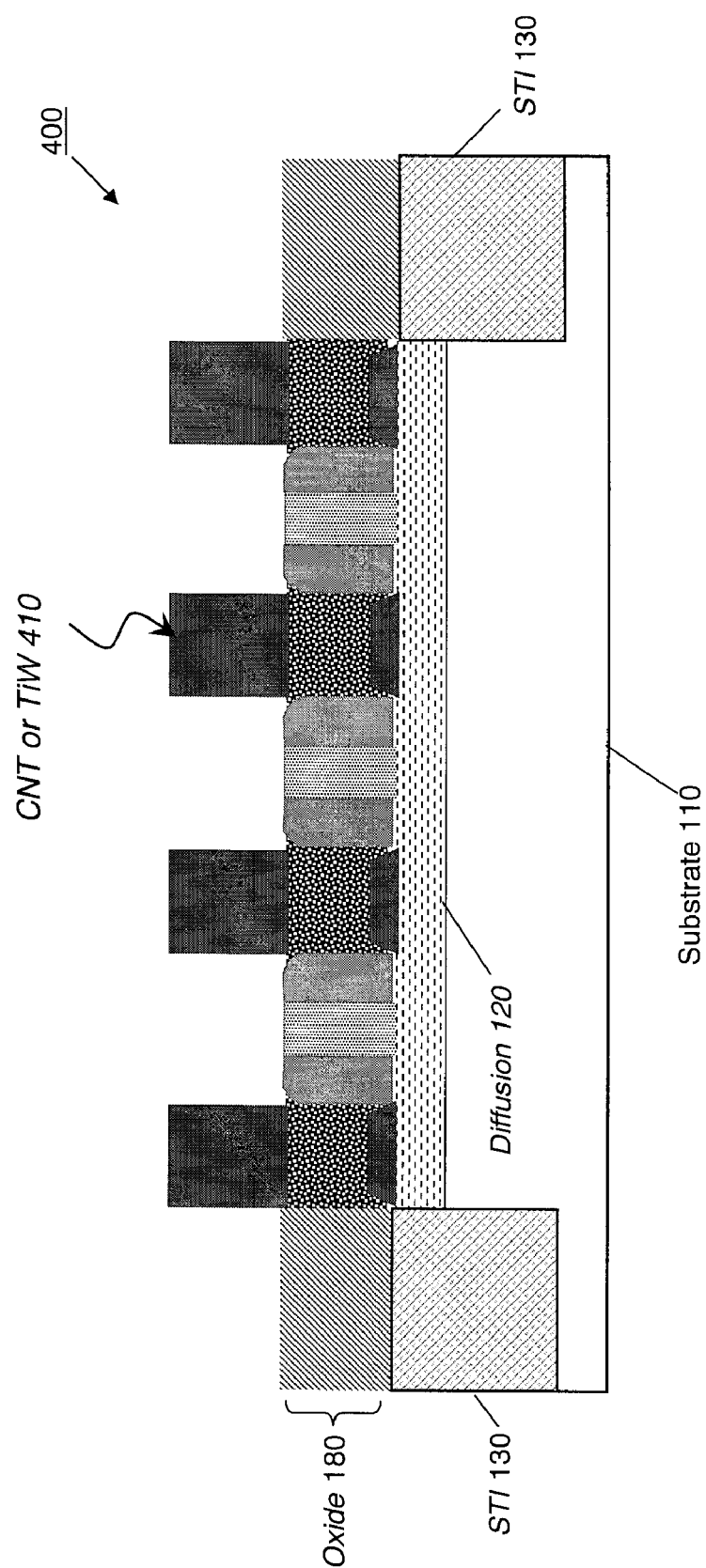
FIG. 5 shows the cross-section A-A' following formation of either a carbon nano tube (CNT) or refractory metal contact layer over the electroless plated metal contact according to one embodiment.

In some exemplary embodiments, carbon nano-tube (CNT) bundles are grown vertically on substrates with Co or Ni as the catalyst. FIG. 5 shows the cross-section A-A' of a fourth intermediate fabrication stage 400 following formation of either a carbon nano tube (CNT) or metal contact layer 410 over the electroless plated metal contact 220 according to one embodiment.

In certain embodiments, a refractory metal (e.g., TiW) may be deposited, by a selective plasma deposition scheme, on metal contact 220. In one implementation, the refractory metal is deposited on metal contact 220, desirably, with a higher deposition rate than on oxide 180. The plasma concurrently deposits the refractory metal on the metal contact 220 while acting to remove the refractory metal on the oxide 180. The deposition and plasma etch thus form an anisotropic selective deposition of the refractory metal on metal contact 220. Since the metal gate 150 is passivated (e.g., in the form of aluminum oxide or aluminum fluoride), the refractory metal can be deposited on EL plated Co or Ni on silicide RSD contacts 170. A proper selection of plasma species, comprising oxygen or fluorine, for example, may ensure that the metal gate 150 continues to be passivated during the refractory metal deposition.

Figure 6:
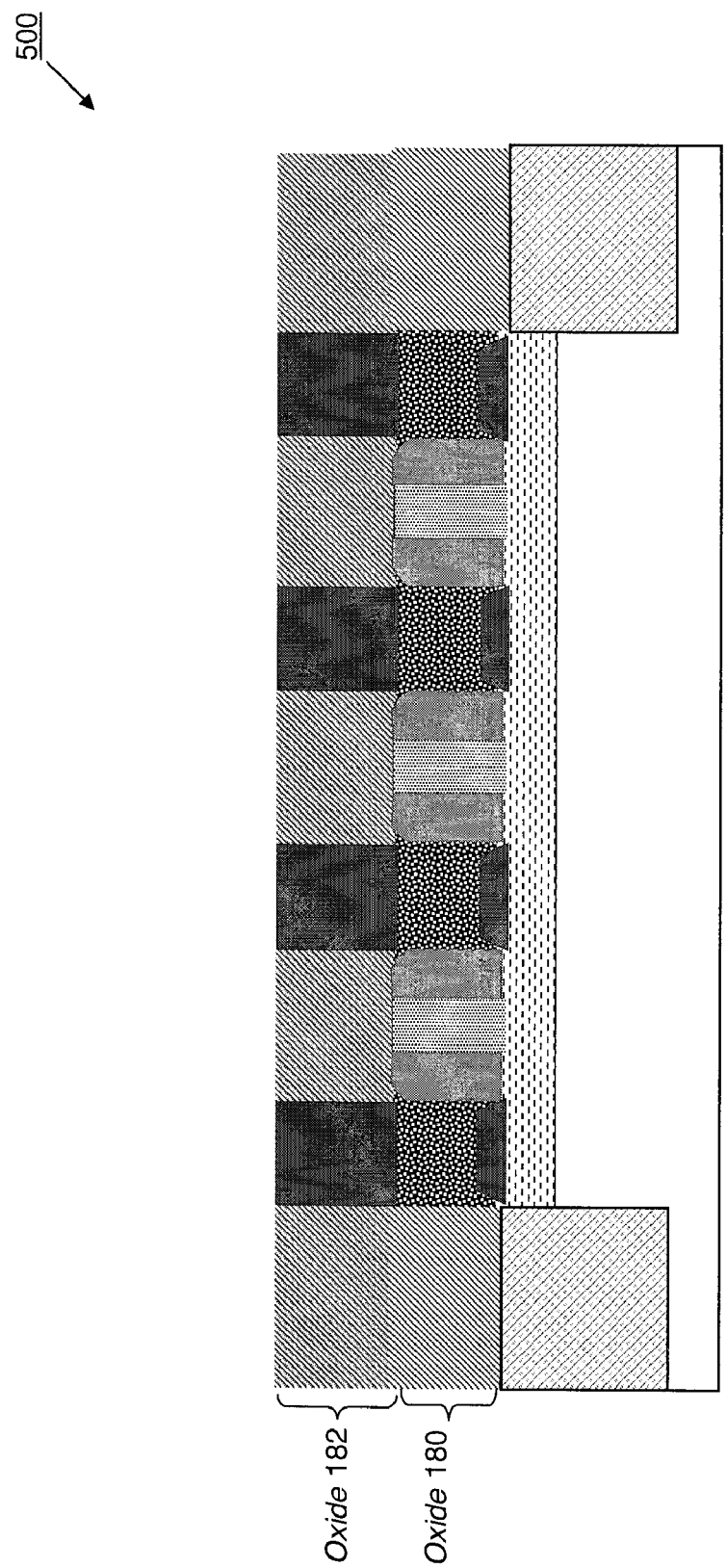
FIG. 6 shows the cross-section A-A' following formation of a planarized layer of deposited oxide according to one embodiment.

FIG. 6 shows the cross-section A-A' of a fifth intermediate stage 500 of fabrication of the transistor following formation of a planarized layer of deposited oxide, according to one embodiment. A layer of oxide may be deposited over oxide 180 to surround (CNT) or metal contact layer 410, after which the surface may be planarized. Referring back to FIG. 1, gate contact 10 can be patterned and formed (e.g., adjacent to the diffusion region 120) at this point. A sequence of various processes, including photomasking, oxide etching, and metal deposition may be employed to form gate contact 10. In one embodiment, CNT layer 410 may be etched out and replaced by the same metal contacting the gates during the deposition process for forming the gate contacts 10.

Figure 7:
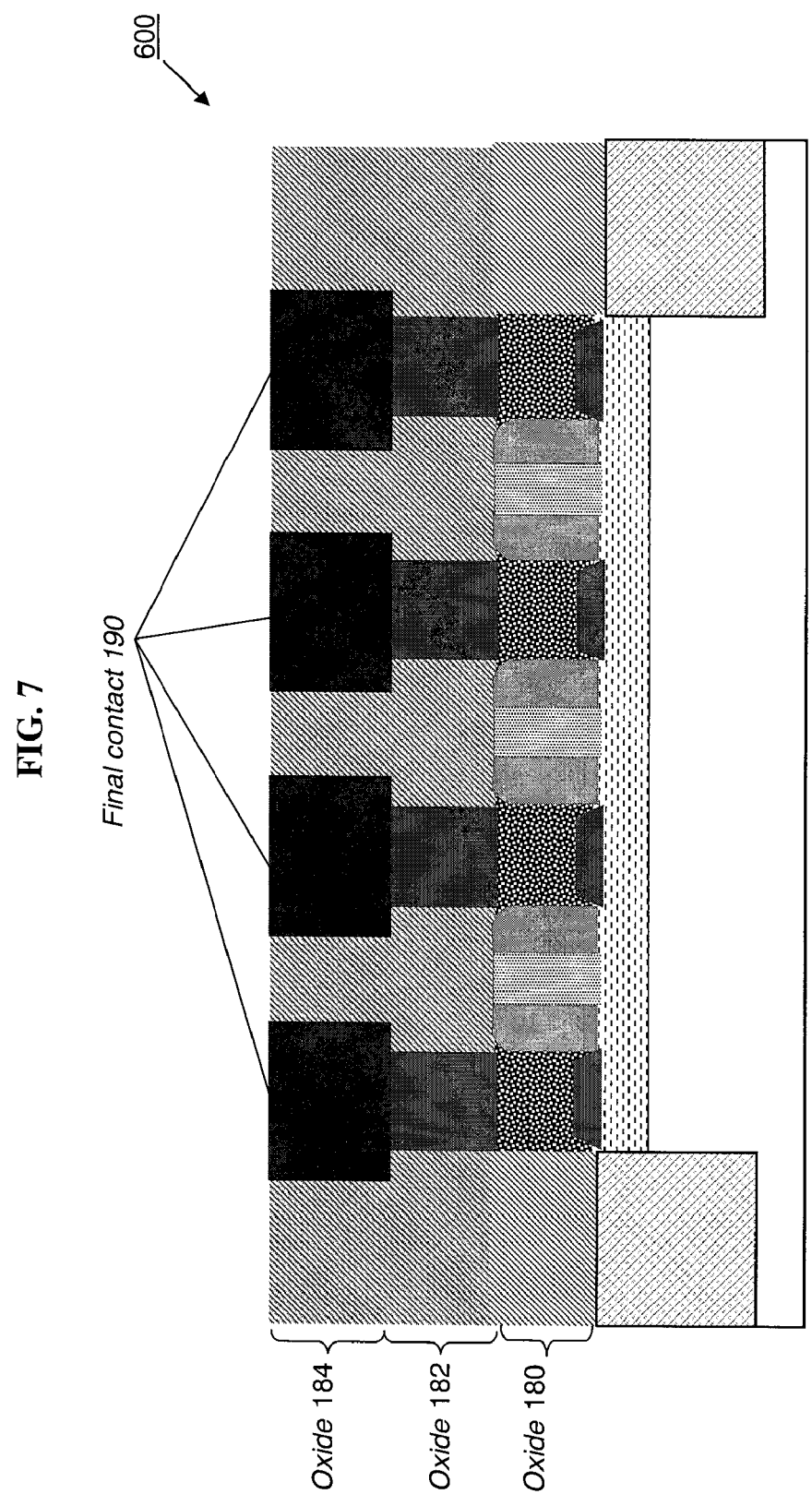
FIG. 7 shows the cross-section A-A' following formation of an interlayer dielectric layer etched and filled with metallization to contact a diffusion layer and contact the gates according to one embodiment.

FIG. 7 shows the cross-section A-A' following formation of an oxide 184 (e.g., interlayer dielectric layer (ILD)) over oxide 182, which may be etched and filled with final contact metallization 190 to contact the diffusion layer 120 by way of contact layer 410, metal contacts 220 and silicided source and drain contacts 170. The same oxide 184 may be, for example, patterned and etched to enable formation of contacts to the gates 150 by etching a region of oxide layers including one or more of 180, 182 and 140 opposite diffusion layer 120, as shown in FIG. 1. The contact metal 190 in one embodiment may be comprised of copper or tungsten.

For simplification, it is appreciated that the methods and structures disclosed herein may not require replacement of a metal by an insulator to protect the gate, as the gate oxide layer that forms on Al may be sufficient to prevent electroless deposition thereon while disposing metal on other regions containing catalyst atoms to support deposition, such as, for example, electroless plating.

The various embodiments described above have been presented by way of example and not by way of limitation. It should be understood that the processes, methods, and the order in which the respective elements of each method are performed are purely exemplary. Depending on the implementation, they may be performed in a different order or in parallel, unless indicated otherwise in the present disclosure.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multi-chip package (such as a ceramic carrier that has either or both surface interconnections or buried interconnections).

In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A transistor structure comprising:
a semiconductor substrate having a first surface;
a diffusion region formed at the first surface;
an aluminum gate formed over the diffusion region;
insulating side walls formed adjacent to the aluminum gate;
an oxide or fluoride layer on the aluminum gate and not on the insulating sidewalls;
silicided source and drain contacts formed over the diffusion region adjacent to the side walls;
a first oxide layer formed over the substrate;
one or more vias formed in the first oxide layer over the silicided source and drain contacts; and
a first metal layer disposed in the via to form a metal contact.

2. The structure of claim 1, wherein the insulating side walls are insulators with etch properties that are selectively different from the first oxide layer.

3. The structure of claim 2, wherein the oxide or fluoride layer is formed by a plasma oxide etch that is used to form the vias in the first oxide layer.

4. The method of claim 3, further comprising a second metal layer disposed on the first metal layer and not on the oxide or fluoride layer on the aluminum gate.

5. The method of claim 4, wherein the second metal layer comprises vertically grown carbon nano tube bundles.

6. The method of claim 4, wherein the second metal layer comprises a refractory metal.

7. A transistor structure comprising:
a semiconductor substrate;
a gate dielectric formed on the semiconductor substrate;
a metal gate formed on said gate dielectric, said metal gate comprising a metal;
a pair of sidewall spacers formed on opposite sides of metal gate a thin passivation film on said metal gate and not on said sidewall spacers, wherein said thin passivation film is selected from the group consisting of an oxide of said metal and a fluoride of said metal; and a source/drain region in said substrate on opposite sides of said metal gate.

8. The semiconductor device of claim 7 wherein said thin passivation film has a thickness sufficient to prevent plating on said metal gate electrode.

9. The semiconductor device of claim 7 further comprising a dielectric layer on said thin passivation layer on said metal gate and on said pair of sidewall spacers.

10. The semiconductor device of claim 7 further comprising a first metal layer disposed above said pair of source/drain regions and not above said thin passivation film on said metal gate.

* * * * *